United States Patent
Graef et al.

(10) Patent No.: US 6,189,131 B1
(45) Date of Patent: Feb. 13, 2001

(54) METHOD OF SELECTING AND SYNTHESIZING METAL INTERCONNECT WIRES IN INTEGRATED CIRCUITS

(75) Inventors: Stefan Graef, Milpitas; Emery O. Sugasawara, Pleasanton, both of CA (US)

(73) Assignee: LSI Logic Corporation, Milpitas, CA (US)

(*) Notice: Under 35 U.S.C. 154(b), the term of this patent shall be extended for 0 days.

(21) Appl. No.: 09/007,242

(22) Filed: Jan. 14, 1998

(51) Int. Cl.[7] .................................................. G06F 17/50
(52) U.S. Cl. .................................................. 716/8; 716/18
(58) Field of Search ........................ 395/500.09, 500.13; 716/18, 8, 10, 11

(56) References Cited

U.S. PATENT DOCUMENTS

| | | | |
|---|---|---|---|
| 4,713,773 | * 12/1987 | Cooper et al. | 716/15 |
| 5,475,611 | * 12/1995 | Nagase et al. | 395/500.14 |
| 5,487,018 | * 1/1996 | Loos et al. | 364/489 |
| 5,500,804 | * 3/1996 | Honsinger et al. | 364/488 |
| 5,610,833 | * 3/1997 | Chang et al. | 395/500.12 |
| 5,629,860 | * 5/1997 | Jones et al. | 395/500.07 |
| 5,666,290 | * 9/1997 | Li et al. | 364/491 |
| 5,729,467 | * 3/1998 | Katsumata et al. | 716/15 |
| 5,737,580 | * 4/1998 | Hathaway et al. | 395/500.13 |
| 5,901,063 | * 5/1999 | Chang et al. | 364/488 |

OTHER PUBLICATIONS

Ciesielski "Layer Assignment for VLSI Interconnect Delay Minimization," IEEE Transactions on Computer–Aided Design, vol. 8, No. 6, Jun. 1989, pp. 702–707.*

Sabelka and Selberherr "SAP—A Program Package for Three–Dimesnional Interconnect Simulation," Proceedings of the 1998 International Interconnect Technology Conference, Jun. 1–3, 1998, pp. 250–252.*

Wang and Kuh "A New Timing–Driven Multilayer MCM/IC Routing Algorithm," 1997 IEEE Multi–Chip Module Conference, Feb. 4–5, 1997, pp. 89–94.*

(List continued on next page.)

*Primary Examiner*—Kevin J. Teska
*Assistant Examiner*—Leigh Marie Garbowski
(74) *Attorney, Agent, or Firm*—Mitchell, Silberberg & Knupp LLP

(57) ABSTRACT

A method for assigning signals to specific metal layers through the use of interconnect wire load models that are metal layer dependent. The method allows synthesis and layout tools to route signal wires on select metal layers at an early stage in the design process. A technology library for use in designing integrated circuits is provided. In addition to traditional library components such as logic gate information, the technology library includes routing wire load models that are metal layer dependent. The wire load information reflects the electrical properties of signal wires formed on different metal layers, and provides more accurate timing estimates than generic wire delay values. The additional information influences the delay calculations of the synthesis process in such a way that the delay a signal encounters on a specific metal layer can be approximated very closely. Of significance to the present invention, a wire-metal layer attribute file is compiled by the synthesis process. The wire-metal layer attribute file output directs layout tools to route individual signals on specific metal layers. Alternatively, the layout tool can utilize the wire-metal layer attribute file to determine a set of acceptable routing layers, allowing an optimal route for a signal to be chosen in relation to the requirements of other signals.

20 Claims, 4 Drawing Sheets

OTHER PUBLICATIONS

Joy and Ciesielski "Layer Assignment for Printed Circuit Boards and Integrated Circuits," Proceedings of the IEEE, vol. 80, No. 2, Feb. 1992, pp. 311–331.*

Chang and Du "Layer Assignment Problem for Three–Layer Routing," IEEE Transactions on Computers, vol. 37, No. 5, May 1988.*

EDA Electronic Design Automation/Nov. 3, 1997, Exploring the world of design tools that translate today's ideas into tomorrow's products Verification Is Revolutionizing The IC Design Process by Cheryl Ajluni; (5 pages).

Electronic Design/Oct. 13, 1997; Digital Design, Exploring the world of digital, logic, memory, and microprocessors; The System–On–A–Chip: It's Not Just A Dream Anymore; by Dave Bursky (8 pages).

Internet reference—http://www.lsilogic.com/products/5_4r.html. ASIC Products: FlexStream™ Design Solution; ASIC CAD & Methodology From LSI Logic Corporation; (6 pages).

Internet reference—http://www.lsilogic.com/products/5_4q.html.ASIC CAD & Methodology From LSI Logic Corporation; FlexStream™ ASIC Deep Submicron Design Solution (14 pages).

Internet reference—http.//www.lsilogic.com/techlib/.LSI Logic/Synopsys Optimized Submicron Design; Last updated Feb. 7, 1997; Optimized Synthesis Libraries (2 pages).

* cited by examiner

METHOD OF SELECTING AND SYNTHESIZING METAL INTERCONNECT WIRES IN INTEGRATED CIRCUITS

BACKGROUND OF THE INVENTION

1. Field of the Invention

The invention relates to the synthesis and design of integrated circuits, and more particularly to assigning interconnect wires to specific metal layers through the use of interconnect wire load models that are metal layer dependent.

2. Description of the Related Art

Integrated circuits have become key components of many consumer and commercial electronic products, often replacing discrete components and enhancing product functionality. The semiconductor processing technologies that produce these integrated circuits have advanced to the point where complete systems can now be reduced to a single integrated circuit or application specific integrated circuit (ASIC) device. These integrated circuits (also referred to as "chips") may incorporate many functions that previously could not be implemented together on a single chip, including: microprocessors, digital signal processors, mixed signal and analog functions, large blocks of memory and high speed interfaces. The requisite level of integration, however, significantly complicates the design and manufacturing processes.

One difficult task facing integrated circuit manufacturers is interconnecting the millions of logic gates and megabytes of memory that may be present on a chip. To aid in this task, new metallization schemes have been developed that allow five or more distinct "levels" or layers of metal interconnect wires, with pitches of 0.125 $\mu$m and tighter on the first few layers. Additionally, new planarization procedures such as chemical-mechanical polishing help to flatten the insulating oxide layers between the metal layers in order to provide an even surface for subsequent lithography steps. These techniques eliminate potential optical distortion that may occur when subsequent layer patterns are formed using photolithographic techniques, and allow finer dimensions to be created. In most multiple layer metallization schemes, the various metal interconnect wires have different nominal widths and heights, different distances from transistor gates, and are insulated by oxide layers of varying thickness.

As semiconductor processes migrate into the deep submicron range with multiple metal layers, increased circuit speeds allow the delay caused by the metal to reach the magnitude of active elements. The aforementioned differences in the physical properties of the metal layers cause different metal layers to exhibit somewhat dissimilar electrical characteristics, resulting in disparities in propagation delays that a signal experiences when communicated over routing wires formed from the different metal layers. Today's integrated circuit verification and synthesis tools do not adequately account for such differences, instead relying on generic wire delay models for all metal layers to estimate actual delays. The inherent inaccuracies of these generic models may result in a signal path that does not perform as expected.

When performing timing analysis on a typical integrated circuit design, synthesis and timing analysis tools initially estimate timing information using the generic wire delay values. To improve timing accuracy, post placement or layout timing information can be back-annotated to these EDA tools. Standard file formats, such as the standard delay format (SDF), the design exchange format (DEF), and the physical design exchange format (PDEF), are used to pass data between floorplanning and the synthesis environment for interconnect delay modeling. This information improves the accuracy of delay values by providing the actual length of metal interconnect wires. In the interest of improving manufacturing yields, functional simulations can then be performed using these estimated delay values. Modifications to the layout database may be required to correct any detected problems. The terms "floorplan" and "layout" refer to the physical geometry of an integrated circuit or die. A floorplan consists of placed groupings of integrated circuit elements that are used by signal wire routing tools in placing and functionally interconnecting the elements. A layout includes the completed integrated circuit design and is represented by a layout database containing information for generating the masks used to fabricate integrated circuits.

The shortcomings in today's wire models can be significant given the larger areas (and corresponding increases in interconnect lengths) typically required by integrated circuits. Often, the performance of the integrated circuitry can be dominated by propagation delays through longer metal interconnect wires rather than the basic gate delays of individual logic elements. This phenomenon is exacerbated by the fact that as the width of a wire shrinks in deep submicron designs, the resistance of the wire increases. It has been estimated that interconnect thus determines as much as 70–80% of the total delay in integrated circuits implemented in 0.25 $\mu$m process rules. An increase in average propagation delays may result in a greater number of critical timing paths (e.g., signal paths in which best or worst case simulated propagation delays may approach the limits required for proper functionality). Many timing problems involve such critical timing paths.

Despite the use of sophisticated EDA tools, timing paths or "nets" do not always perform as expected when the completed integrated circuit is tested. Propagation delays through critical paths sometimes vary from simulated values for any of a number of reasons, most frequently due to mismatches between wire delay models and actual delays. Even when fairly accurate delay models are available to perform post layout timing analysis, there is currently no satisfactory method for incorporating these models into earlier stages of the design flow to reduce costly iterations between synthesis and layout steps to correct timing violations.

SUMMARY OF THE INVENTION

Briefly, the present invention provides a method for using layer specific wire load models in the synthesis and layout of integrated circuits. The method allows synthesis and layout tools to route signal wires on select metal layers at an early stage in the design process.

In a method according to the invention, a technology library for use in designing integrated circuits is provided. In addition to traditional library components such as logic gate information, the technology library includes routing wire load models that are metal layer dependent. The wire load information reflects the electrical properties of signal wires formed on different metal layers, and provides more accurate timing estimates than generic wire delay values.

The multi-layer wire load models supplied to the synthesis tool are used to assign individual signals to a specific metal layer(s). The additional information influences the delay calculations of the synthesis process in such a way that more accurate delay values are calculated, and the delay that a signal encounters on a specific metal layer can be approximated very closely. Of significance to the present invention, a wire-metal layer attribute file is compiled by the synthesis process. The wire-metal layer attribute file output directs layout tools to route individual signals on specific metal layers. Alternatively, the layout tool can utilize the wire-metal layer attribute file to determine a set of acceptable routing layers, allowing an optimal route for a signal to be chosen in relation to the requirements of other signals.

Incorporating layer-dependent wire load information into the initial synthesis and layout steps results in an initial floorplan with improved timing performance. A method according to the invention thereby reduces the number of costly and time-consuming iterations between synthesis and layout steps by expediting timing closure.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
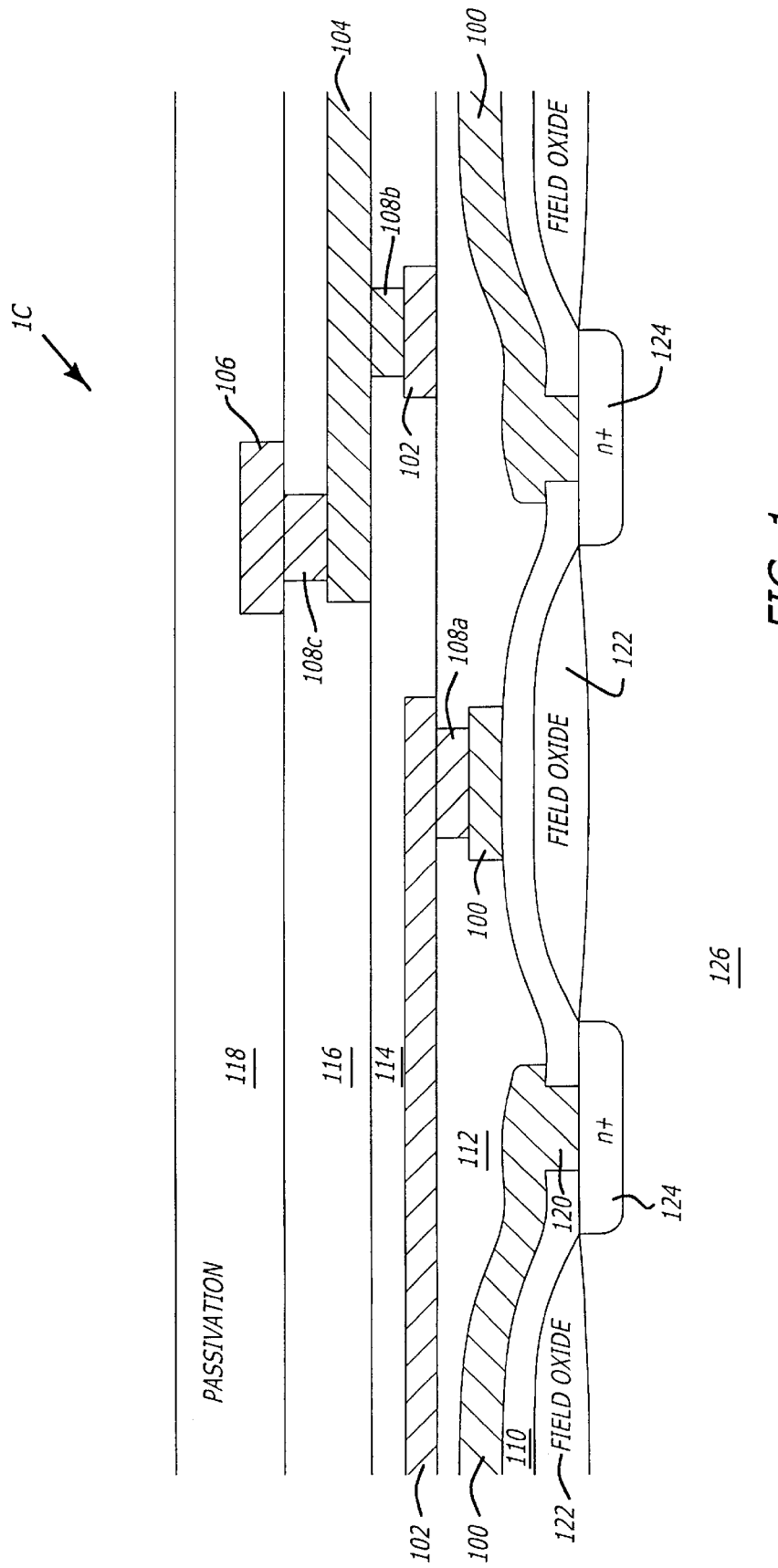
FIG. 1 is a simplified cross-sectional view of an integrated circuit illustrating an exemplary metallization scheme.

Referring now to the drawings, FIG. 1 is a cross-sectional view of an integrated circuit IC illustrating an exemplary multi-layer metallization scheme. The disclosed integrated circuit IC is implemented in a complimentary metal-oxide-semiconductor (CMOS) process having four metal interconnect layers for forming interconnect wires 100, 102, 104 and 106. As will be apparent to those skilled in the art, however, the present invention could be utilized with other numbers of interconnect layers or any type of fabrication process, including bipolar-based or gallium arsenide (GaAs) processes.

The interconnect wires 100–106 are electrically coupled by "via" structures 108a–108c. As known to those skilled in the art, a via 108 is an opening in an insulating layer between metal layers that provides an electrical pathway from one metal layer to the metal layer above or below it.

The various interconnect metal layers may be formed of a variety of materials, including aluminum, copper or a conductive alloy. The interconnect wires 100, 102, 104 and 106 are isolated by a series of oxide layers 110, 112, 114 and 116. The oxide layers 110, 112, 114 and 116 are typically formed of a dielectric or non-conducting film that is grown or deposited on the surface of the integrated circuit IC. Other structural components of the integrated circuit IC include traditional doped regions 124, a field oxide layer 122, and contacts 120, all of which are formed on a substrate 126. Various other traditional components of the CMOS circuitry have been omitted for sake of clarity.

A passivation layer 118 forms the outermost layer of the integrated circuit IC, and covers the various materials. In the disclosed embodiment, the passivation layer 118 is a deposition of a scratch-resistant material, such as silicon nitride and/or silicon dioxide, and functions to prevent the deterioration of electronic properties caused by water, ions, and other external contaminants.

Figure 2:
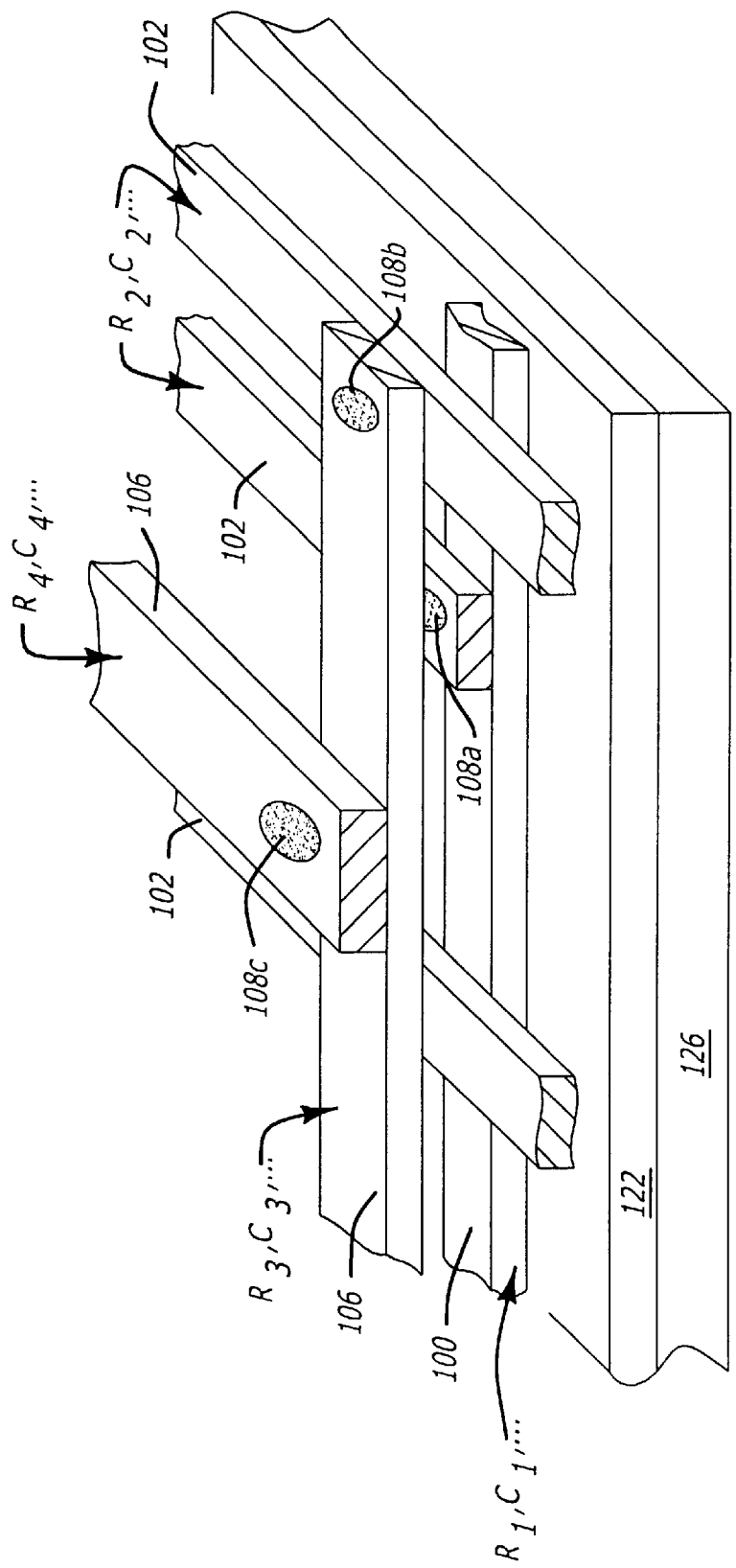
FIG. 2 is a simplified perspective view of a portion of an integrated depicting the relationship between different metal layers in a metallization scheme such as that of FIG. 1.

FIG. 2 provides a simplified perspective view of a portion of an integrated circuit IC further depicting the relationship between different interconnect wires 100–106 in a metallization scheme such as that of FIG. 1. The interconnect wires 100 and 102 are electrically coupled by a via 108a, while the interconnect wires 102 and 104 and 104 and 106 are coupled by vias 108b and 108c, respectively. The interconnect wires 100–106 provide signal routing for the integrated circuit IC, connecting all of the nets in the integrated circuit IC to the ports of various logic elements or signal pins.

In most semiconductor processes, the various metal interconnect wires 100–106 have different nominal widths and heights, different distances from transistor gates, and are insulated by oxide layers of varying thickness. These differences result in variations in the resistance per unit length and capacitance values associated with the interconnect layers 100–106. Other process-related parameters, such as contact 120 and via 108 resistances and capacitances, may also differ. All of the aforementioned values may effect the propagation delay that a signal experiences on a given metal layer. Information regarding the various parameters is preferably derived by the silicon factory manufacturing the integrated circuit IC, and may be determined via empirical testing and simulation.

In the disclosed embodiment of the invention, multi-layer wire load information is associated with the interconnect wires as shown in the following table. As described more fully below in conjunction with FIGS. 3 and 4, this multi-layer wire load information is supplied to synthesis and layout tools for purposes of assigning signals to specific metal layers. The multi-layer wire load information preferably includes a resistance per unit length value $R_1$–$R_4$ associated with the interconnect wires 100–106, respectively, formed on the different metal layers. Further, capacitance per unit length values Cx are preferably associated with the interconnect wires 100–106. The capacitance values Cx may include wire to ground, wire to supply voltage, and wire to wire values. The multi-layer wire load information may also include a range of values for each of the included electrical properties, the range of values reflecting nominal, best case, and worst case manufacturing processes.

| METAL LAYER | RESISTANCE PER UNIT LENGTH Rx | CAPACITANCES Cx (wire-ground, wire-Vsupply, wire-wire) |
|---|---|---|
| Interconnect wire 100 | $R_1$ | $C_1$, . . . |
| Interconnect wire 102 | $R_2$ | $C_2$, . . . |
| Interconnect wire 104 | $R_3$ | $C_3$, . . . |
| Interconnect wire 106 | $R_4$ | $C_4$, . . . |

Although not specifically illustrated, the multi-layer wire load information may also include via 108 and contact 120 resistance and capacitance values. Further, in deep submicron designs, crosstalk between metal layers also becomes a concern. Crosstalk between metal interconnect wires may not only cause a wrong logic result during a particular clock cycle, but also effects the timing behavior of neighboring wires. The electrical differences between the different metal layers on which signals travel may have an impact on crosstalk, with some layers being more susceptible to such effects. Wire to wire capacitance values included in the multi-layer wire load information may be utilized by synthesis tools to estimate crosstalk between metal layers. Signals can then be assigned metal layers in a manner that reduces crosstalk.

Figure 3:
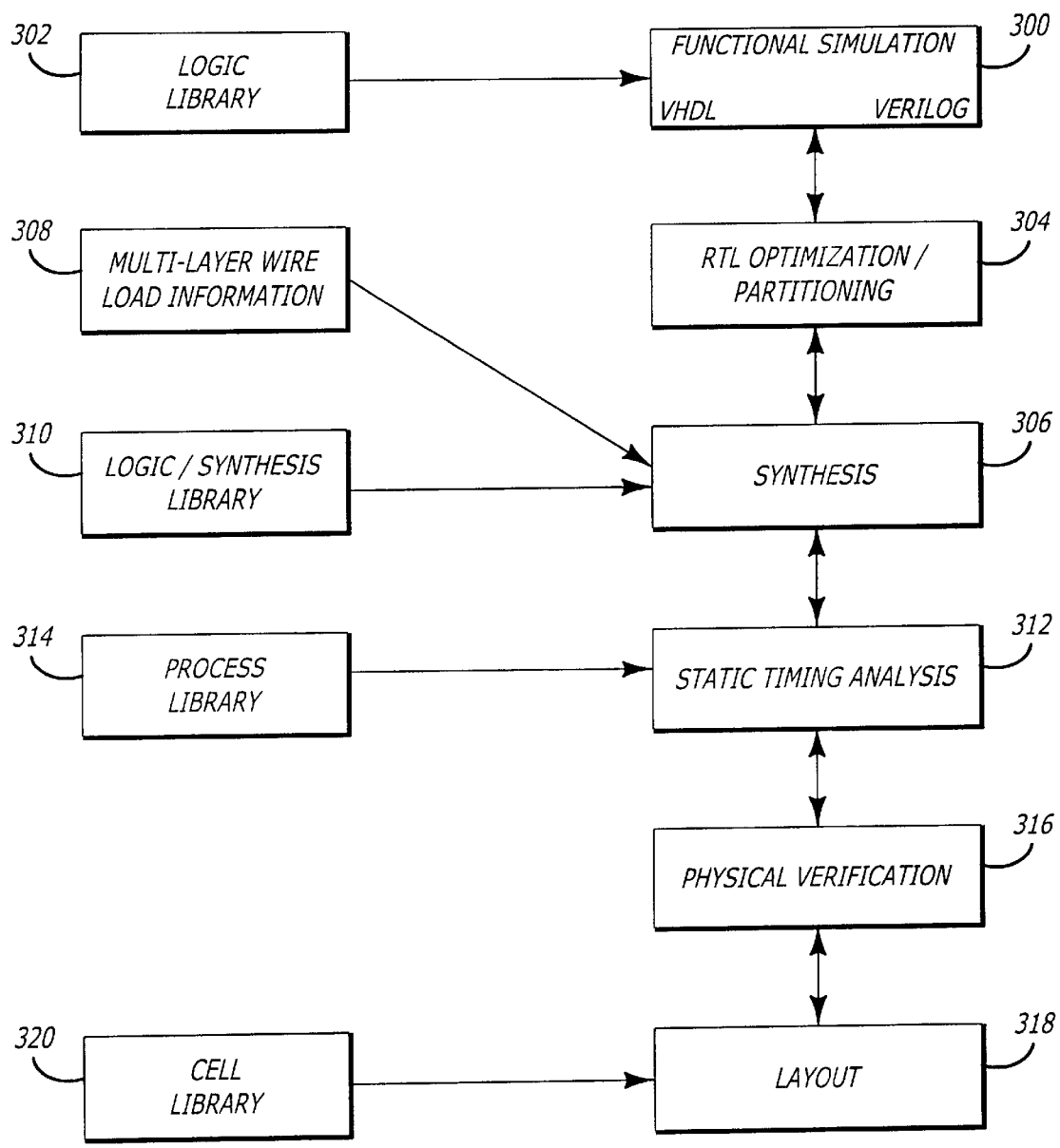
FIG. 3 is a flowchart diagram of an exemplary integrated circuit design methodology utilizing multi-layer wire load information in accordance with the present invention.

Turning now to FIG. 3, a flowchart diagram of an exemplary integrated circuit design methodology utilizing multi-layer wire load information in accordance with the present invention is shown. The design methodology could be implemented in a design flow such as LSI Logic's Flex-stream Design Solution, or in any other proprietary or standardized design flow. The disclosed embodiment of the invention commence in step 300, where a high-level design language (HDL) such as VHDL or Verilog is used by designers to specify top level functions for the integrated circuit IC. The HDL code utilizes various logic functions from a technology logic library 302, which may or may not be proprietary.

Next, in step 304, the specific timing of events is scheduled by creating Register Transfer Level (RTL) level code. RTL refers to a circuit description that involves describing the circuit in terms of storage registers and sequence of transfers of data between the registers. A main goal of RTL optimization is to partition the HDL code into structural elements (e.g., datapath elements), from which preliminary physical placement information can be derived. Accordingly, RTL-level functional floorplanning (also known as "design planning") is used to group timing-sensitive functions. Based on this preliminary floorplanning, preliminary power and timing analysis can be performed at the RTL level.

In step 306, code that results from the compiled HDL code and RTL partitioning is then passed to logic-synthesis tools, which create a circuit netlist based on a synthesis library 310. As described more fully below, multi-layer wire load information 308 is also used in the synthesis process. Prior synthesis tools are generally unable to work with delay information for different metal layers, instead using generic values for all metal layers for the wire load parameter input(s) to the synthesis tools. Synthesis tools according to the present invention, however, utilize the multi-layer wire load information to produce more accurate timing estimates than can be realized with generic wire delay values. The additional information influences the delay calculations of the synthesis process in such a way that the delay that a signal encounters on a specific metal layer can be approximated very closely. A wire-metal layer attribute file is compiled by the synthesis process. The wire-metal layer attribute file output directs layout tools to route individual signals on specific metal layers. The synthesis process thereby produces a gate level description of the design that results in fewer timing errors following layout. It is contemplated that existing synthesis tools, such as Design Compiler by Synopsis, Inc., could be evolved to utilize the multi-layer wire load information of the present invention to produce a wire-metal layer attribute file.

Following the synthesis process of step 306, the design flow proceeds to step 312 for static timing analysis. Static timing analyzers rely on timing models of circuit elements to compare path delays between synchronous elements with required setup and hold times, thus allowing all delay paths to be checked. Timing models and other necessary process information are supplied by a process library 314.

Delay calculators may be used in the static timing analysis of step 312. When delay calculators are used, pre- and post-layout signal delay information is computed and back-annotated into HDL simulators and synthesis tools, and supports static timing analysis tools as the basis for these tools internal delay analysis processes. Preferably, the delay calculator of step 312 is capable of interfacing with all of the CAE tools utilized in the design flow of the integrated circuit IC. To do this, the delay calculator should be configured to read the databases created by the different tools and respect the naming conventions used by the different tools. The delay calculator preferably supports custom (standard) cells, custom blocks, pre-routed blocks, and analog circuitry.

The post-layout signal delay information generated by the delay calculator preferably includes interconnect delay information related to the actual length of the interconnect wires 100–106 in various signal paths or nets of the integrated circuit IC. Numerous delay calculators, such as LSIDELAY by LSI Logic Corporation, are available for calculating such delays, and can produce files in a format (such as SDF) suitable for back annotation into the synthesis tools. According to present invention, pre-layout delays are based on wire load models that reflect differences in the metal layers. Because the accuracy of the wire load models will influence early synthesis results and resulting architectural decisions, the improved wire load models of the invention may decrease development costs incurred by multiple design iterations.

A physical verification step 316 and layout step 318 are also included in the disclosed design methodology. The layout step 318 utilizes a logic cell library and layout netlist to produce the physical design of the integrated circuit IC. Following layout in step 318, a post-layout physical verification (shown as step 316) is performed on the layout of the integrated circuit IC using simulation tools such as Synopsis VSS or Verilog-XL. If no problems are detected, post-layout verification accomplishes final sign-off of the design so that the design can enter a production phase. In addition to achieving timing closure, this verification phase runs design rule checks, verifies test vectors, and creates design statistics.

Figure 4:
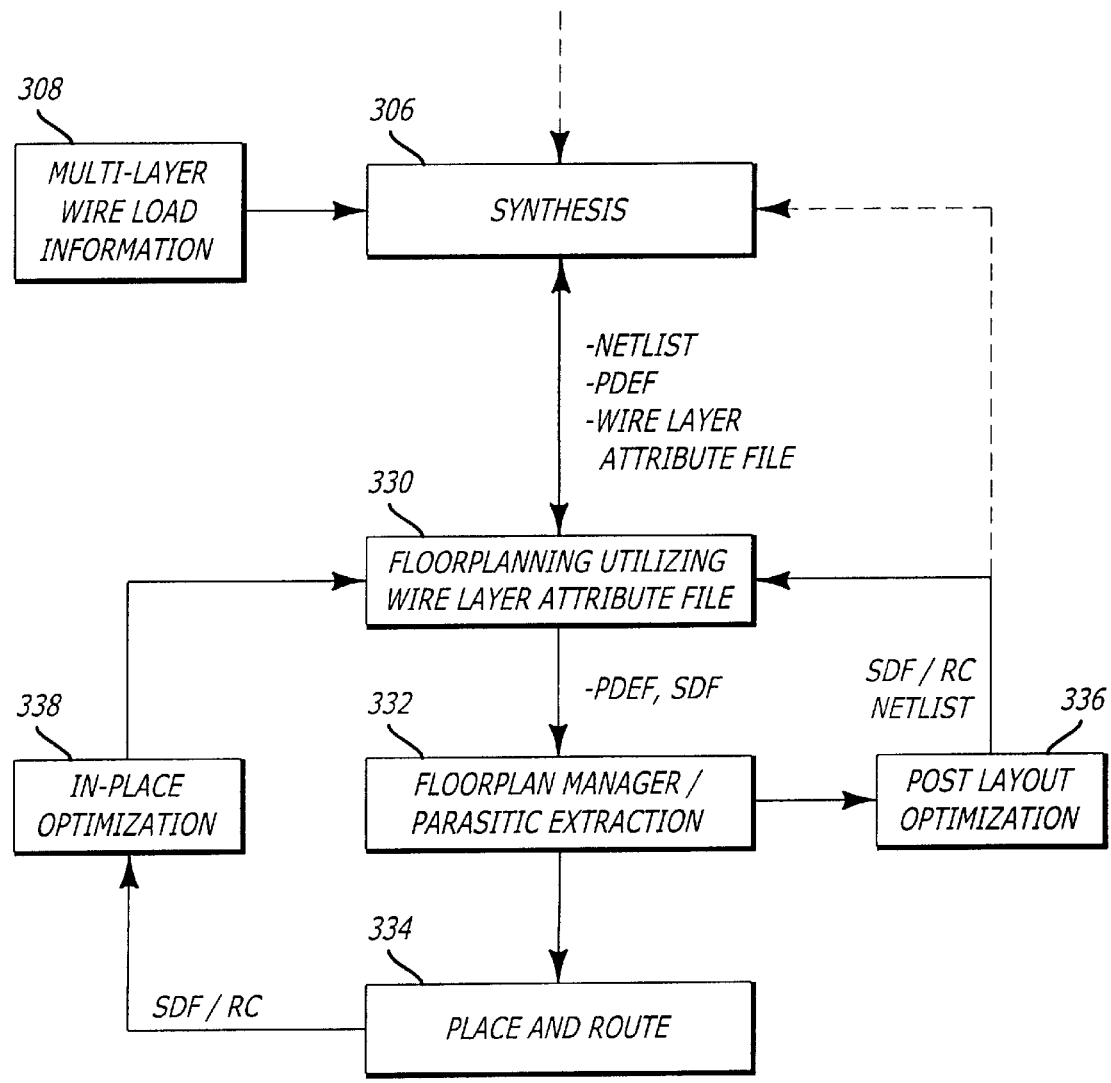
FIG. 4 is a flowchart diagram providing further details of the exemplary integrated circuit design methodology of FIG. 3.

Referring now to FIG. 4, a flowchart diagram providing further details of the integrated circuit design methodology of FIG. 3 is provided. The illustrated interaction between the synthesis step 306 and the remaining physical design steps is exemplary in nature. As will be appreciated by those skilled in the art, many variations, additions, and subtractions to the illustrated layout methodology are possible, and the precise ordering of the steps is not considered critical to the invention. Static timing analysis and physical verification steps have been omitted for sake of clarity. Further, standardized file formats such as the standard delay format (SDF), the design exchange format (DEF), and the physical design exchange format (PDEF) may be used to pass data between floorplanning and the synthesis environment for interconnect delay modeling, although the invention is not limited in scope to particular file formats.

As with prior design methodologies, a layout netlist and PDEF file are generated in the synthesis process 306 for use in the physical design or layout of an integrated circuit IC. The netlist reflects the interconnectivity of the logic elements of an integrated circuit IC, while the PDEF file contains information regarding the physical hierarchy of the logic elements Of significance to the present invention, a wire layer attribute file is also compiled by the synthesis process 306. The wire-metal layer attribute file directs physical design tools to route individual signals on specific metal layers. Alternatively, layout tools can utilize the wire-metal layer attribute file to determine a set of acceptable routing layers, allowing an optimal route for a signal to be chosen in relation to the requirements of other signals. By utilizing the wire layer attribute file in the physical design process, iterations between synthesis and layout are minimized and circuit performance is enhanced.

Further, the netlist supplied by the synthesis step 306 may change as a result of the greater flexibility allowed by the new wire load information 308. The synthesis tools now have the capability to select less resistive metal layers to carry heavy loads on far traveling signals. Thus, the structure of buffering circuitry necessary to provide acceptable signal strength (e.g., rise/fall times, transition delays) within the constraints supplied by the circuit designer and/or technology library may change.

Following synthesis of the integrated circuit design in step 306, a top-level physical hierarchy (or floorplan) for the integrated circuit design is generated in step 330 using the information provided by the wire layer attribute file. In step 332, floorplan management software (such as the Floorplan Manager tool produced by Synopsys, Inc.) receives delay and physical information from the floorplanning tool(s) of step 330 for purposes of optimizing timing while controlling the impact of the physical design structure of the integrated circuit IC layout. More specifically, in the disclosed embodiment of the invention PDEF information provides the floorplan manager access to the physical hierarchy created in steps 306 and 330. The floorplan management software can then be utilized to generate wire load and delay information based on the physical placement of integrated circuit IC components. The floorplan management software also maintains both the logical and physical hierarchies of the integrated circuit IC, and provides this information to the layout tools of step 334. During the place and route procedure of step 334 (this is also referred to as the "layout" step), a layout database containing interconnected representations of the individual elements of an integrated circuit IC is generated. The layout database is essentially a complete integrated circuit design and contains information for generating the masks used to fabricate the integrated circuit IC.

After full place and route of the design in step 334, better timing accuracy is available because precise wire lengths can be extracted. As noted above, signal delays are highly correlated with wire resistance and capacitance, some of which is due to wire length, and some of which is due to three-dimensional parasitic capacitive effects resulting from multi-level routing. The full chip layout database may be analyzed to generate a parasitic RC (resistance-capacitance) netlist. Timing delays may then be computed, and the results fed back to synthesis tools and floorplanning tools for timing verification.

At later stages in the physical design process, incremental optimization may be performed to correct timing violations detected after back annotation of computed SDF delay information and RC data. To correct timing violations and other signal integrity problems, the designer may choose to perform minimal design changes (e.g., swapping of logic cells, addition/deletion of buffers, etc.) using In-Place Optimization as shown in step 338. Alternatively the designer may choose to perform more substantial changes using additional path restructuring capabilities in the Post Layout Optimization of step 336. The Post Layout Optimization of step 336 generates floorplanning and synthesis information in the form of an SDF file/RC. This information is communicated to the software tools of steps 306 and 330. Once any necessary or desirable changes have been made by synthesis tools of step 306, the changes are communicated back to the floorplanning tools in the form of PDEF information.

Thus, a method for assigning signals to specific metal layers through the use of interconnect wire load models that are metal layer dependent has been described. In addition to providing improved timing estimates, the method reduces discrepancies between pre- and post-layout timing values. This, in turn, reduces the number of iteration loops between the logical and physical design of the integrated circuit.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for designing an integrated circuit having multiple metal layers for forming interconnect wires for communicating signals between circuit components, the method comprising the steps of:

(a) providing a technology library, the technology library comprising wire load information reflecting electrical properties of signal wires formed on individual metal layers;

(b) assigning individual signals to specific metal layer(s) based on the wire load information; and (c) laying out the circuit components on the integrated circuit, wherein step (b) is performed prior to step (c).

2. The method of claim 1, wherein step (c) comprises generating a layout database for the integrated circuit, the layout database directing the individual signals to be manufactured on the assigned metal layers.

3. The method of claim 1, wherein the wire load information comprises resistance values for interconnect wires formed on each of the metal layers.

4. The method of claim 3, wherein heavily loaded signals are assigned to metal layer(s) having relatively less resistance per unit length than other metal layers.

5. The method of claim 3, wherein the wire load information further comprises capacitance values for interconnect wires formed on each of the metal layers.

6. The method of claim 5, wherein heavily loaded signals are assigned to metal layer(s) having relatively less capacitance per unit length than other metal layers.

7. The method of claim 1, wherein the wire load information comprises electrical property values reflecting best case and worst case manufacturing process variations.

8. The method of claim 1, wherein the wire load information further comprises resistance values for via structures between adjacent ones of the metal layers.

9. The method of claim 1, wherein step (b) comprises assigning predetermined signals to a set of acceptable metal layers.

10. An integrated circuit manufactured in accordance with the method of claim 1.

11. A method for designing an integrated circuit for manufacture in a semiconductor process utilizing multiple metal layers to form interconnect wires for communicating signals between circuit components, the method comprising the steps of:

providing a technology library, the technology library comprising wire load information reflecting electrical properties of signal wires formed on individual metal layers;

generating a high-level design language description of the integrated circuit;

synthesizing the high-level design language description of the integrated circuit to generate a layout netlist and a wire-metal layer attribute file relating individual signals of the layout netlist to specific metal layers, the specific metal layers being selected based on the wire load information of the technology library; and performing physical layout of the integrated circuit based on the layout netlist and wire-metal layer attribute file, the physical layout being represented by a layout database.

12. The method of claim 11, wherein the wire load information comprises resistance values for interconnect wires formed on each of the metal layers.

13. The method of claim 12, wherein the wire-metal layer attribute file relates heavily loaded signals to metal layer(s) having relatively less resistance per unit length than other metal layers.

14. The method of claim 12, wherein the wire load information further comprises capacitance values for interconnect wires formed on each of the metal layers.

15. The method of claim 14, wherein the wire-metal layer attribute file relates heavily loaded signals to metal layer(s) having relatively less capacitance per unit length than other metal layers.

16. The method of claim 11, wherein the wire load information comprises electrical property values reflecting best case and worst case manufacturing process variations.

17. The method of claim 11, wherein the wire load information further comprises resistance values for via structures between adjacent ones of the metal layers.

18. An integrated circuit manufactured in accordance with the method of claim 11.

19. The method of claim 11, wherein the step of generating a high-level design language description of the integrated circuit is performed by either of VHDL-based tools or Verilog-based tools.

20. The method of claim 11, further comprising the steps of:

extracting signal delay information from the layout database; and performing static timing analysis using the extracted signal delay information.

* * * * *